Nov. 4, 1969 J. A. COPELAND III 3,477,029

CIRCUITS USING AN LSA OSCILLATOR AS AN AMPLIFIER

Filed May 21, 1968 2 Sheets-Sheet 1

INVENTOR
J. A. COPELAND, III
BY

ATTORNEY

United States Patent Office 3,477,029

Patented Nov. 4, 1969

3,477,029
CIRCUITS USING AN LSA OSCILLATOR AS AN AMPLIFIER

John A. Copeland III, Gillette, N.J., assignor to Bell Telephone Laboratories, Incorporated, Murray Hill and Berkeley Heights, N.J., a corporation of New York Filed May 21, 1968, Ser. No. 730,726
Int. Cl. H03f *3/04*
U.S. Cl. 330—5 7 Claims

ABSTRACT OF THE DISCLOSURE

The semiconductor specimen of an LSA diode extends transversely across a waveguide, with the LSA oscillator circuitry being external to the waveguide. In one embodiment, signal wave energy is amplified as it propagates through the specimen, and in another embodiment, it is amplified as it is reflected from the specimen.

BACKGROUND OF THE INVENTION

This invention relates to bulk-effect devices, and more particularly, to limited space-charge accumulation (LSA) devices that may be used as amplifiers.

The patent of J. B. Gunn, 3,365,583 describes a family of bulk-effect devices, each comprising a wafer of appropriate semiconductor material such as gallium arsenide, in which traveling domain oscillations can be excited through the application of a bias voltage above a prescribed threshold value. These traveling domains result from a known mechanism of electron transfer between conduction band valleys which establishes a negative differential resistance to internal currents in the wafer and are manifested by oscillatory current in the output terminals, now generally known as Gunn-effect oscillations.

The copending patent application of J. A. Copeland III, Ser. No. 564,081, filed July 11, 1966, and assigned to Bell Telephone Laboratories, Incorporated, and the paper by J. A. Copeland III, "A New Mode of Operation for Bulk Negative Resistance Oscillators," Proceedings of the IEEE, October 1966, pages 1479–1480, describe how a new mode of oscillation, called the LSA mode (for Limited Space-Charge Accumulation), can be induced in bulk-effect devices of the general type described in the Gunn patent. This new mode of oscillation is not dependent on the formation of traveling domains, its frequency is not dependent on wafer length, and as a result, the oscillator does not have the frequency and power limitations of the Gunn oscillator. The LSA mode oscillator includes a bulk-effect semiconductor diode, a resonant circuit, and a load, the various parameters of which are adjusted such that the electric field intensity within the diode alternates between a high value at which negative resistance occurs, and a lower value at which the diode displays a positive resistance. By appropriately adjusting the duration of electric field excursions into the positive and negative resistance regions of the diode, one can prevent the formation of traveling domains responsible for Gunn-effect oscillation, while still obtaining the negative resistance required for sustained oscillations.

The copending application of J. A. Copeland III, Ser. No. 647,419, filed June 20, 1967 and assigned to Bell Telephone Laboratories, Incorporated, describes how signal energy applied to the terminals of an LSA diode can be amplified due to the negative resistance within the diode. The energy that can be amplified by the disclosed apparatus, however, is limited to frequencies which are lower than the LSA oscillation frequency divided by the figure of merit of the resonant circuit.

SUMMARY OF THE INVENTION

It is an object of this invention to provide a solid state high frequency amplifier.

This and other objects of the invention are attained in an illustrative embodiment thereof comprising a waveguide for propagating signal wave energy to be amplified. Extending across the waveguide is a specimen of bulk-effect material which constitutes part of an LSA oscillator circuit. Any LSA oscillator of course requires a bias source for the semiconductor diode and a resonator for causing the electric field in the diode to alternate as explained above. These elements are preferably external to the waveguide and are isolated from the waveguide.

As the signal propagates through the specimen, it encounters a negative resistance during one portion of each cycle of LSA oscillation, and a positive resistance during the remaining portion. During the negative resistance portion, however, the signal wave grows exponentially; hence, if the specimen is made sufficiently long, as will be explained later, the signal wave energy will experience a net gain and will therefore be amplified.

In another embodiment, the specimen is located at a terminated end of the waveguide. A source of signal waves is coupled to an input end of the waveguide by a circulator, with a load being connected to another port of the circulator. By designing the LSA oscillator such that the negative resistance of the specimen is approximately equal to the positive impedance of the signal source, signal waves will be very efficiently reflected and amplified by the specimen during the negative resistance portions of each cycle of oscillation. Those signal waves that are reflected during the negative resistance portion of each cycle experience a gain that more than compensates for the attenuation occurring during the positive resistance portions. Hence, the reflected signal energy directed by the circulator to the load is amplified.

Unlike the amplifier of the application Ser. No. 647,419, the signal energy frequency is not limited by the LSA oscillation frequency, and indeed, is preferably much greater than the LSA frequency.

DRAWING DESCRIPTION

These and other objects, features and advantages of the invention will be better understood from a consideration of the following detailed description taken in conjunction with the accompanying drawing in which.

DETAILED DESCRIPTION

Figure 1:
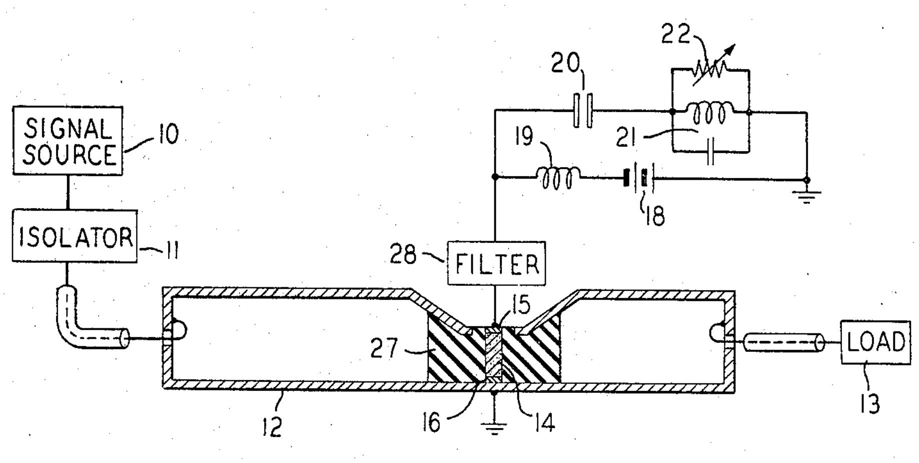
FIG. 1 is a schematic drawing of a microwave amplifier in accordance with an illustrative embodiment of the invention.
Figure 2:
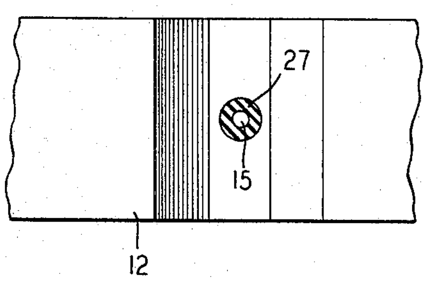
FIG. 2 is a top view of part of the waveguide of FIG. 1.

Referring now to FIG. 1, there is shown a microwave amplifier circuit comprising a source 10 of signal waves to be amplified, an isolator 11, a waveguide 12, and a load 13. Extending transversely across the waveguide 12 is an LSA diode comprising a specimen 14 of bulk-effect material such as n-type gallium arsenide contained between opposite ohmic contacts 15 and 16. As illustrated in FIG. 2, the specimen may have a cylindrical shape. Included outside the waveguide is an LSA oscillator circuit comprising a direct current bias source 18, a radio-frequency choke 19, a radio-frequency by-pass capacitor 20, a resonant tank circuit 21, and an oscillator load resistance 22.

The external LSA oscillator circuit causes the diode specimen 14 to oscillate in the LSA mode, and as such, the specimen displays an alternately negative and positive resistance to signal energy from source 10 that is propagating in the waveguide toward the load 13. During the negative resistance period, the signal wave energy grows exopnentially as it propagates through the specimen 14, which more than compensates for the attenuation occurring during the positive resistance portion, thus giving the signal a net gain. The amplified signal is of course coupled out of the waveguide and transmitted to the load 13 for utilization.

Figure 3A:
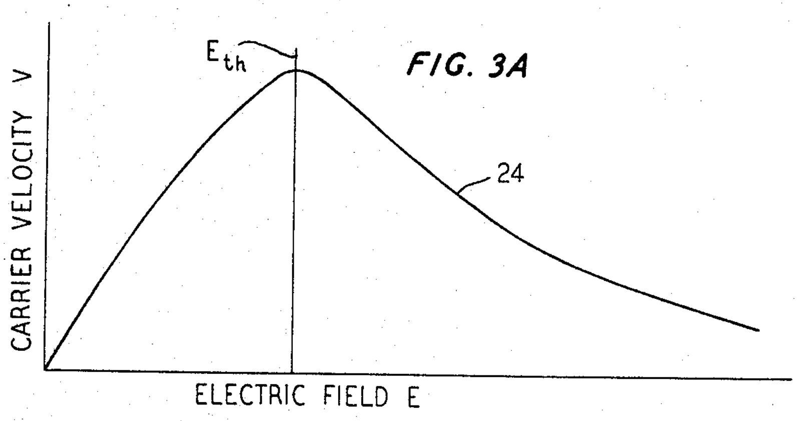
FIG. 3A is a graph of electron velocity $v$ versus electric field E in the diode of the circuit of FIG. 1.
Figure 3B:
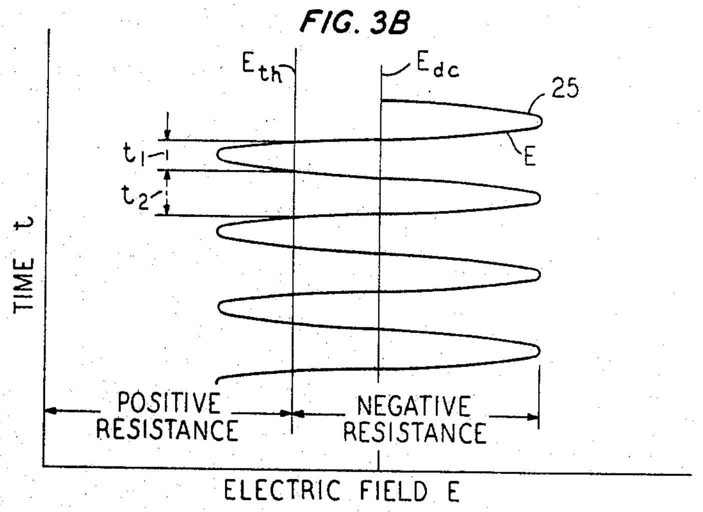
FIG. 3B is a graph of time $t$ versus electric field E in the diode of the circuit of FIG. 1 illustrating LSA mode oscillation.

While the mechanism of LSA oscillator operation is well known, such operation will be reviewed by reference to FIGS. 3A and 3B. One requirement is that the diode specimen be of substantially uniform constituency and be doped in a known manner to give a negative resistance characteristic as shown by curve 24 of FIG. 3A. For purposes of this application, the term bulk-effect device shall mean any semiconductor device having a carrier velocity versus electric field characteristic of the general type shown in FIG. 3A. For n-type materials, the carrier velocity refers to electron velocity and for p-type materials it refers to hole velocity. At applied bias fields in excess of its threshold voltage $E_{th}$, the specimen displays a negative resistance, while at voltages lower than $E_{th}$, it displays a positive resistance. If a steady D-C voltage in excess of $E_{th}$ were applied to the specimen, traveling domain oscillations would be excited as is described generally in the Gunn patent.

While the direct current electric field $E_{dc}$ applied to the specimen by D-C source 18 exceeds the threshold voltage $E_{th}$ as shown in FIG. 3B, the external tank circuit 21 and load resistance 22 causes the actual electric field E in the specimen to oscillate as is shown by curve 25 of FIG. 3B. During the time interval $t_1$ of each cycle of E the electric field in the diode extends below the threshold voltage $E_{th}$ into the positive resistance region of the diode, while during the remaining portion of the cycle $t_2$, it extends into the negative resistance region above $E_{th}$. The frequency of E is determined by the oscillator resonant circuit 21, while the amplitude is a function of the load resistance 22 of the circuit.

In spite of the fact that the electric field E extends into the positive resistance region, the gain of the device at its LSA oscillation frequency will exceed its attenuation if the following relationship is satisfied:

$$\frac{1}{t_1+t_2}\int^{(t_1+t_2)} Evdt < E_{dc}v_a \qquad (1)$$

where the integral is taken over one cycle, E is the electric field in the specimen, $v$ is the carrier velocity, and $v_a$ is the average carrier drift velocity in the specimen during oscillation. Traveling domains in the specimen are prohibited by making the time interval $t_2$ small enough so that substantial space-charge accumulation cannot occur during that time interval, and by making $t_1$ sufficiently long to attenuate space-charge accumulation to prevent it from growing with succeeding cycles. To meet these requirements, the following relations should also be satisfied, $$\frac{ne}{\epsilon}\int^{(t_2)}|\mu|dt < 10 \qquad (2)$$

$$\frac{ne}{\epsilon}\int^{(t_1)}|\mu|dt > \frac{ne}{\epsilon}\int^{(t_2)}|\mu|dt \qquad (3)$$

where $\int^{(t_2)}$ is the integral taken over the time period $t_2$, $n$ is the carrier concentration of the specimen, $\epsilon$ is the permitivity of the specimen, $\mu$ is the differential mobility of the specimen, $dv/dE$, $e$ is the charge on a majority carrier and $\int^{(t_1)}$ is the integral taken over time $t_1$.

In order to give the oscillating field E sufficient amplitude to extend into the positive resistance region and to rise sharply into the negative resistance region, the circuit should be "lightly loaded"; i.e., the effective parallel load resistance should be fairly high. For an n-type gallium arsenide diode it is recommended that the load resistance conform to the relationship $$R_L > \frac{l}{n_o|\mu|eA} \qquad (4)$$

where $R_L$ is the load resistance, $l$ is the length of the specimen between opposite ohmic contacts, $n_o$ is the doping level or average carrier concentration of the specimen, A is the area of the sample in the plane transverse to the drift current, and $\mu_2$ is the average mobility in the negative resistance region which is given by $$|\mu_2| = \frac{1}{t_2}\int^{(t_2)}|\mu|dt \qquad (5)$$

With fulfillment of the above conditions, the oscillator circuit operates in the LSA mode without the formation of traveling domains within specimen 14. As is known, LSA oscillations may be initiated either by transient effects or through the application of a burst of R-F energy.

Assuming that the LSA oscillatory frequency is much lower than the signal frequency, many cycles of the signal wave will propagate through specimen 14 during the time period $t_2$ during which the specimen presents a negative resistance. During such propagation, it can be shown that the signal energy will grow exponentially. During the time periods $t_1$, the signal wave will be attenuated by the positive resistance of the specimen, but the energy loss cannot be greater than the input energy during $t_1$, whereas the energy gained during $t_2$ can be many times the input energy. Because of the exponential growth during the negative resistance portion of each cycle, and because the negative resistance portion $t_2$ is normally longer than $t_1$, the average gain of signal waves propagating through the specimen will normally be greater than 1 and the signal wave will be amplified.

From the foregoing, it can be appreciated that a net gain is assured if the negative resistance during time $t_2$ is of sufficient magnitude and if the length $x$ of the sample in the direction of wave propagation is sufficient to give substantial exponential growth during the negative resistance portion. Normally, net gain can be assured merely by using a specimen 14 that give good LSA oscillations and does not have an unduly small length $x$ in the direction of wave propagation. The net gain of the device G is given by $$G = \frac{t_1 \exp.(-x/\delta_1) + t_2 \exp.(-x/\delta_2)}{t_1+t_2} \qquad (6)$$

where $\delta_1$ is the skin depth of the specimen 14 in the positive resistance region and $\delta_2$ is the skin depth in the negative resistance region. Equations for skin depths $\delta_1$ and $\delta_2$ are given in the paper "Doping Uniformity and Geometry of LSA Oscillator Diodes" by J. A. Copeland III, IEEE Transactions on Electron Devices, vol ED-14, No. 9, September 1967, pages 497–500; the paper shows that in the negative resistance region the skin depth $\delta_2$ is negative. A net gain can be assured merely by making the gain G greater than 1 or, $$\frac{t_1 \exp.(-x/\delta_1)+t_2 \exp.(-x/\delta_2)}{t_1+t_2}>1 \quad (7)$$

In addition to making the gain greater than 1, care should be taken to minimize reflection losses at the specimen 14. The waveguide 12 is preferably tapered in a known manner to match the impedance of the specimen 14 to that of the waveguide. Additionally, dielectric matching sections 27 are preferably also included to match the dielectric constant of specimen 14 to the dielectric constant of the waveguide. As is known, section 27 should be an odd number of quarter wavelengths long and their dielectric constants should be approximately equal to the geometric means of the dielectric constants of the waveguide and specimen 14. With these provisions, signal energy reflection is minimal, and any energy that is reflected is absorbed by the isolator 11.

Only those electric fields accompanying the signal wave that extend in the direction of carrier drift in the specimen will experience gain. Thus, the waveguide should be designed such that signal waves have a predominant electric field component that is parallel to the bias electric field in the specimen. Waveguides that transmit waves in the more common waveguide modes, such as the $TE_{01}$ mode, meet this requirement.

The LSA oscillation frequency is preferably adjusted to be below the cut-off frequency of propagation in the waveguide, whereby the oscillation energy is isolated from the waveguide. On the other hand, a high frequency band-stop filter 28 is included in the LSA oscillator circuit to prevent signal energy from propagating into the oscillator circuit.

Due to alternate gain and attenuation, the amplified signal may be expected to contain harmonic frequency components of both the LSA oscillation frequency and the signal, which may be filtered out if so desired. Generally speaking, the harmonic frequency component can be reduced by increasing the signal frequency with respect to the LSA frequency; for this reason, it is recommended that the signal frequency be at least twice the LSA frequency and preferably greater.

Figure 4:
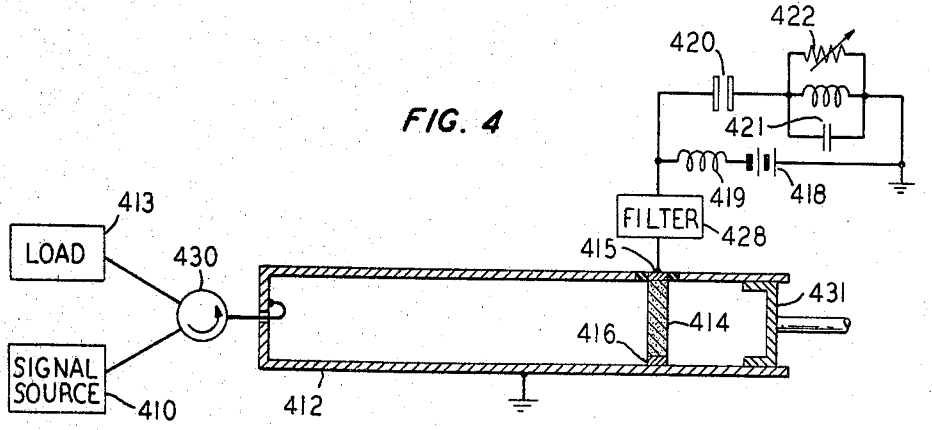
FIG. 4 is a schematic drawing of the microwave amplifier in accordance with another embodiment of the invention.

The apparatus of FIG. 4 illustrates how an LSA diode specimen may be used to amplify and reflect signal waves rather than transmit the signal waves. Those reference numbers of FIG. 4 in which the last two digits correspond to a reference number of FIG. 1 indicate elements having functions that correspond to those of FIG. 1; for example, specimen 414 of FIG. 4 corresponds to specimen 14 of FIG. 1.

During operation, the specimen 414 is caused to oscillate in the LSA mode as before, to give a period of negative resistance during each cycle of its oscillation. Signal energy to be amplified is coupled from source 410 to the wave guide 412 by a circulator 430. As is known, if the negative resistance of a lumped waveguide termination is equal in magnitude to the source impedance of signal waves in the waveguide, then the negative resistance element will very efficiently reflect such signal waves. Accordingly, specimen 414 is designed to give a negative resistance during the negative resistance portions of each cycle which is approximately equal in magnitude to the impedance of the signal source 410 as seen by the specimen 414. Under this condition, signal waves will be amplified by the negative resistance and be efficiently reflected back toward circulator 430 which directs them to load 413 for utilization. During the positive resistance portion of each cycle, some of the signal energy is also reflected, but in the process it is attenuated as it would be from any unmatched positive resistance.

As is known, the conductivity $g$ of a bulk-effect diode is given by the relation $$g=n_o e dv/dE \quad (8)$$

From this equation, one skilled in the art can determine the negative resistance of the diode during the negative resistance portion of the cycle and can tailor that negative resistance to be of a magnitude approximately equal to the source impedance. Since the specimen 414 reflects, rather than propagates signal waves, it can be considered as being a lumped circuit element as opposed to a distributed circuit element as in FIG. 1. As such, it can be considered as being a negative resistance in parallel with a capacitance which is determined by its dielectric constant, its cross-sectional area, and its length $l$ between opposite ohmic contacts 415 and 416. Maximum reflection is further obtained by axially moving a tuning plunger 431 at the end of the waveguide 412 to tune out the capacitance. Being a lumped element, the length of specimen 414 in the direction of wave propagation is not of first order importance, as opposed to the embodiment of FIG. 1 in which the specimen 14 is a distributed circuit element.

The foregoing embodiments are intended to be merely illustrative of the principles of the invention. For example, waveguides other than those shown, including coaxial cables, could alternatively be used to transmit the signal waves. While the specimen is shown as being cylindrical, it could have a wafer shape or any of a number of other configurations. Various other embodiments and modifications may be made by those skilled in the art without departing from the spirit and scope of the invention.

What is claimed is:

1. A microwave amplifier comprising:
a waveguide;
a specimen of bulk-effect material extending transversely across the interior of the waveguide;
means for producing LSA mode oscillations within the specimen; and
means for directing signal energy to be amplified through the waveguide.

2. The amplifier of claim 1 wherein:
the waveguide is incapable of propagating energy of a frequency below a prescribed cut-off frequency; and
the LSA mode oscillations are of a lower frequency than the cut-off frequency.

3. The amplifier of claim 2 wherein:
the waveguide transmits signal energy from an input end to an output end; and
the sample is located between the input end and the output end.

4. The amplifier of claim 3 wherein:
the sample is characterized by a positive resistance during a portion $t_1$ of each cycle of LSA mode oscillation, a negative resistance during a portion $t_2$ of each cycle of LSA mode oscillation; and wherein:

$$\frac{t_1 \exp.(-x/\delta_1)+t_2 \exp.(-x/\delta_2)}{t_1+t_2}>1$$

where $x$ is the length of the sample in the direction of propagation of the signal wave; $\delta_1$ is the skin depth of the sample during the positive resistance portion $t_1$, and $\delta_2$ is the skin depth of the specimen during the negative resistance portion $t_2$.

5. The amplifier of claim 1 wherein:
the sample is located in proximity to a terminated end of the waveguide; and
the sample constitutes means for reflecting signal energy in the waveguide.

6. The amplifier of claim 5 wherein:
a source of signal energy is connected to an input end of the waveguide; and
the magnitude of the negative resistance of the sample during the cycle portions $t_2$ is approximately equal to the magnitude of the impedance of the source.

7. A microwave amplifier comprising:
a specimen of semiconductor material which exhibits positive or negative differential conductance depending upon the magnitude of electric field therein;

means for applying to the specimen an electric field that alternates between values that cause the differential conductance of the specimen to be positive and values that cause the differential conductance to be negative, said electric field alternating in such a manner that space-charge does not accumulate and cause excessive distortion of the internal electric field; and means for introducing a signal into the specimen, whereby such signal is amplified while the specimen is in the negative conductance state.

No references cited.

ROY LAKE, Primary Examiner

D. R. HOSTETTER, Assistant Examiner

U.S. Cl. X.R.

330—12, 34, 53; 331—107